United States Patent
Hailu et al.

(10) Patent No.: US 9,755,817 B2
(45) Date of Patent: Sep. 5, 2017

(54) COMPACT PHASE INTERPOLATOR

(71) Applicant: QUALCOMM Incorporated, San Diego, CA (US)

(72) Inventors: Eskinder Hailu, Cary, NC (US); Hanan Cohen, San Diego, CA (US); Li Sun, Irvine, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/013,914

(22) Filed: Feb. 2, 2016

(65) Prior Publication Data
US 2017/0222789 A1   Aug. 3, 2017

(51) Int. Cl.
| | |
|---|---|
| H04L 7/00 | (2006.01) |
| H03K 5/13 | (2014.01) |
| H03K 5/135 | (2006.01) |
| H03K 5/131 | (2014.01) |
| H03H 17/08 | (2006.01) |
| H03H 11/22 | (2006.01) |

(52) U.S. Cl.
CPC ........... *H04L 7/0025* (2013.01); *H03H 17/08* (2013.01); *H03K 5/13* (2013.01); *H03K 5/131* (2013.01); *H03K 5/135* (2013.01); *H03H 11/22* (2013.01)

(58) Field of Classification Search
CPC .......... H03K 5/131; H03K 5/135; H03K 5/13; H04L 7/0025; H03H 11/22; H03H 17/08
See application file for complete search history.

(56) References Cited

U.S. PATENT DOCUMENTS

| | | | |
|---|---|---|---|
| 8,427,217 B1 | 4/2013 | Le Grand De Mercey et al. | |
| 8,558,597 B2 | 10/2013 | Agrawal et al. | |
| 8,664,993 B2 | 3/2014 | Gu | |
| 8,995,600 B1* | 3/2015 | Gopalakrishnan | H04L 7/0331 375/376 |
| 2005/0285763 A1 | 12/2005 | Nguyen et al. | |
| 2011/0050312 A1 | 3/2011 | Fujino | |
| 2011/0241746 A1* | 10/2011 | Fu | H03H 11/265 327/276 |
| 2015/0188554 A1* | 7/2015 | Chong | H03K 3/0231 327/158 |

FOREIGN PATENT DOCUMENTS

| | | |
|---|---|---|
| DE | 102014106336 A1 | 11/2015 |
| GB | 2415101 A | 12/2005 |
| WO | WO-2013095431 A1 | 6/2013 |

OTHER PUBLICATIONS

Gustaysson et al., CMOS Data Converters for Communications, Kluwer Academic Publishers, 2002, pp. 95-96.*
Partial International Search Report and Written Opinion—PCT/US2016/067334—ISA/EPO—dated Apr. 5, 2017.

* cited by examiner

*Primary Examiner* — Michelle M Koeth
(74) *Attorney, Agent, or Firm* — Haynes and Boone, LLP (57) ABSTRACT

A phase interpolator is provided with a plurality of slices. Each slice includes a first switch for mixing a first clock signal into an interpolated output signal and a second switch for mixing a second clock signal into the interpolated output signal. In response to a high-resolution signal, at least one of the slices may switch on both the first switch and the second switch.

13 Claims, 6 Drawing Sheets

COMPACT PHASE INTERPOLATOR

TECHNICAL FIELD

This application relates to phase interpolators, and more particularly to a compact phase interpolator with increased resolution.

BACKGROUND

Phase interpolators are typical components in clock recovery circuits and related applications. To provide an interpolated clock signal, a phase interpolator interpolates between two or more input clock signals. A conventional phase interpolator interpolates to provide an output clock that ranges in phase between the two input clocks responsive to a tuning signal. The resolution of a phase interpolator between its input clocks depends on the resolution (number of unique states) of the tuning signal. For example, suppose that a phase interpolator interpolates between a 90 degree input clock and a 180 degree input clock. If the resolution of the tuning signal is 5 bits (32 levels), then there would be 30 intermediate phase values between the two extremes of 90 degrees and 180 degrees. Similarly, if the resolution of the tuning signal is 3 bits (8 levels), then there would be six intermediate phase values between the two extremes of 90 degrees and 180 degrees.

It is conventional for the tuning signal to be thermometer encoded. Each bit of the resulting thermometer-encoded tuning signal controls a corresponding slice in the phase interpolator. In particular, each bit controls whether a transistor conducts or not in the corresponding slice. For a 3-bit resolution, the phase interpolator would then include seven slices. The resulting thermometer-encoded 3-bit tuning signal would range from a value of [0000000] to [1111111]. For the tuning signal of all zeros, none of the corresponding transistors in the slices would conduct. For the tuning signal of [1111111], all of the corresponding transistors in the slices would conduct. Although the resulting phase interpolation is conventional, note that increasing the resolution requires additional slices. For example, 4 bits of resolution would require 15 slices whereas 5 bits of resolution requires 31 slices. The resulting multitude of slices consumes excessive die area and results in undesirable power consumption.

Accordingly, there is a need in the art for improved phase interpolators that can achieve greater resolution while conserving die space and power.

SUMMARY

A phase interpolator with increased resolution is provided having a digital mixer including a plurality of slices that are responsive to a high-resolution signal. The slices are configured to respond to an encoded tuning signal to couple either a first clock signal or a second clock signal to a mixer output node when the high-resolution signal has a first binary value. For example, the encoded tuning signal may have a first numeric value when the high-resolution signal equals the first binary value. Each slice in the first numeric value of the slices couples a first clock signal to the mixer output node. A difference between the total number of slices in the mixer and the first numeric value equals a second numeric value. Each slice in the second numeric value of the slices couple the second clock signal to the output node when the high-resolution signal equals the second binary value.

The first numeric value of the slices also couple the first clock signal to the mixer output node responsive to the encoded tuning signal when the high-resolution signal equals a second binary value. But in this case, not only does each slice in the second numeric value of the slices couples the second clock signal to the output node responsive to the encoded tuning signal when the high-resolution signal equals the second binary value but also a slice in the first numeric value of the slices couples the second clock signal to the mixer output node. This slice thus simultaneously couples the first clock signal and second clock signal to the output node responsive to the encoded tuning signal when the high-resolution signal equals the second binary value. Such simultaneous coupling effectively doubles the resolution of the resulting phase interpolator as compared to conventional approaches with the same total number of slices. In this fashion, phase interpolation resolution is significantly enhanced without requiring additional slices, which saves power and increases density.

These and other advantageous features may be better appreciated through the following detailed description.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To provide increased density without requiring an excessive number of slices, a phase interpolator is provided that interpolates between a pair of clock signals responsive to an n-bit tuning signal and an additional tuning signal (e.g., a one-bit additional tuning signal). A thermometer encoder encodes the n-bit tuning signal into a $(2^n-1)$ bit-wide encoded tuning signal. In addition, an adder adds a complement of the n-bit tuning signal with the one-bit additional tuning signal to form a complement tuning signal. The adder saturates at n-bits so that the complement tuning signal is also limited at n bits in width despite the addition of the one-bit additional tuning signal. The thermometer encoder also encodes the complement tuning signal into a $(2^n-1)$ bit-wide complement encoded tuning signal.

The phase interpolator acts as a digital mixer to mix a first clock signal responsive to the encoded tuning signal with a second clock signal responsive to the complement encoded tuning signal. To provide the digital mixing, the phase interpolator includes a plurality of ($2^n-1$) slices so that the width of the n-bit tuning signal also matches the number of slices in the phase interpolator. There is a one-to-one correspondence between each bit of the first encoded tuning signal and each slice in the phase interpolator. Each slice has a first inverter that inverts a first clock signal to drive an internal node common to all the slices if the corresponding bit in the encoded tuning signal is asserted. There is also a one-to-one correspondence between each bit in the complement encoded tuning signal and each slice in the phase interpolator. Each slice has a second inverter that inverts a second clock signal to drive the internal node if the corresponding bit in the complement encoded tuning signal is asserted.

The addition with the one-bit additional tuning signal is quite advantageous as the resulting phase resolution of the phase interpolator is effectively doubled as compared to conventional n-bit digital mixing schemes. Despite this doubling of resolution, the number of slices is left unchanged, which greatly increases density and saves power as compared to conventional approaches that would require more slices to achieve the same resolution. In that regard, it is conventional to achieve n bits of resolution in a digital phase interpolator using ($2^n-1$) slices. In such a conventional approach, 3 bits of resolution (eight different phases for the digital mixer output signal) requires 7 slices. In the same fashion, 4 bits of resolution requires 15 slices, and so on. But the doubling of resolution through the addition of the one-bit additional tuning signal enables the disclosed phase interpolator to achieve $2^{n+1}-1$ different phases for the digital mixer output signal using only ($2^n-1$) slices.

For example, if each bit in the n-bit wide tuning signal equals a binary one, then all the bits in the encoded tuning signal are asserted (each equaling a binary one). In such a case, the first inverter in each of the corresponding slices would all invert the first clock signal to drive the internal node accordingly. The complement tuning signal is then all zeros for such a state for the tuning signal. A conventional complement encoded tuning signal would thus also be all zeros. But the addition of the one-bit additional tuning signal allows the disclosed complement encoded tuning signal to include a binary one despite each bit in the tuning signal equaling a binary one. The second inverter in the corresponding slice to the asserted bit in the complement encoded tuning signal will thus mix the second clock signal into the output node. There would thus be a first output phase for the phase interpolator that results from all the bits in the encoded tuning signal being asserted (binary high) and the bits in the complement encoded tuning signal all being de-asserted (binary low). But there would also be a second output phase for the phase interpolator that results from the bits in the encoded tuning signal being all asserted and just one of the bits in the complement encoded tuning signal being asserted. In this fashion, each conventional setting for the encoded tuning signal has two possible output phases associated with it (except for the case in which the bits in the encoded tuning signal are all de-asserted).

As another illustration of this advantageous doubling of resolution, consider the case if the encoded tuning signal has only one of its bits equaling a binary zero. A conventional complement encoded tuning signal would then have one of its bits equaling a binary one. However, the addition with the one-bit additional tuning signal allows the disclosed complement encoded tuning signal to have either a single one of its bits or two of its bits equal a binary one despite the encoded tuning signal having just a single one of its bits equaling a binary zero. More generally, the addition of the one-bit additional tuning signal allows the disclosed complement encoded tuning signal to have either m or (m+1) of its bits equal a binary one when the encoded tuning signal has m of its bits equaling a binary zero, where m is an integer greater than or equal to zero.

Figure 1:
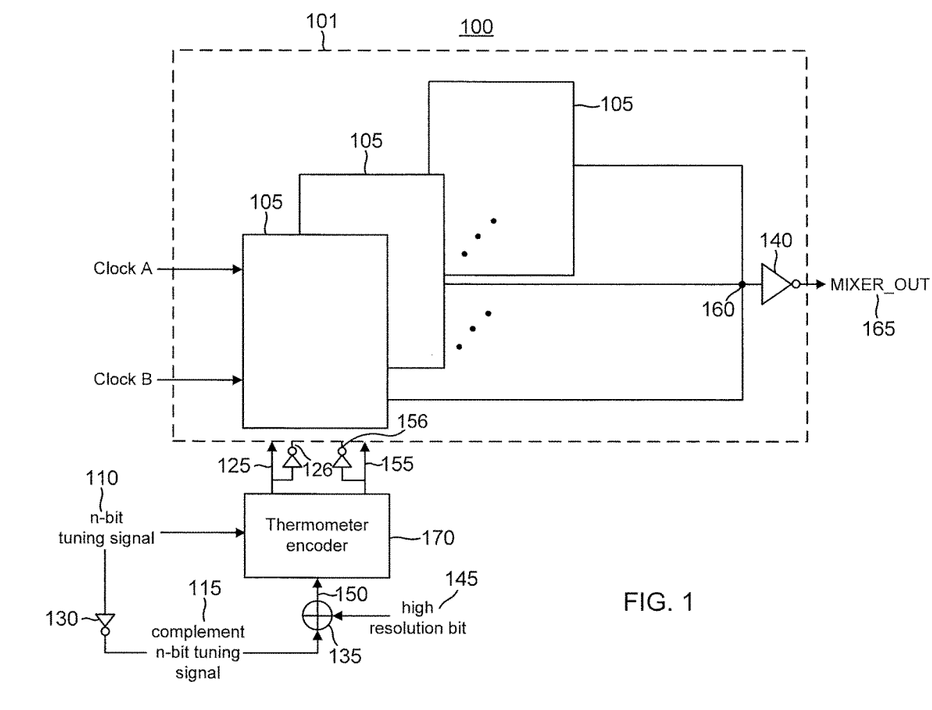
FIG. 1 is a diagram of a phase interpolator in accordance with an aspect of the disclosure.

Turning now to the drawings, an example digital phase interpolator 100 is shown in FIG. 1. A thermometer encoder 170 encodes an n-bit tuning signal 110 into a ($2^n-1$) bit encoded tuning signal 125. A complement of n-bit tuning signal 110 such as through inversion in an inverter 130 forms a complement n-bit tuning signal 115. An adder 135 adds a one-bit additional tuning signal 145 to complement n-bit tuning signal 115 to form a sum complement tuning signal 150. The addition in adder 135 is saturated at n-bits so that sum complement tuning signal 150 is also an n-bit wide signal despite the addition of one-bit additional tuning signal 145. Thermometer encoder 170 encodes sum complement tuning signal 150 into an encoded complement tuning signal 155. Due to the saturation at n-bits in adder 135, encoded complement tuning signal 155 comprises ($2^n-1$) bits analogous to encoded tuning signal 125. A first inverter inverts encoded tuning signal 125 into an inverted encoded tuning signal 126. Similarly, a second inverter inverts encoded complement tuning signal 155 into an inverted encoded complement tuning signal 156.

Phase interpolator 100 includes a digital mixer 101 that digitally mixes a clock signal A responsive to encoded tuning signal 125 with clock signal B responsive to encoded complement tuning signal 155. Digital mixer 101 includes a plurality of ($2^n-1$) slices 105. Each slice 105 has a one-to-one correspondence with each bit in the encoded tuning signal 125 (and to each bit in inverted encoded tuning signal 126) as well as a one-to-one correspondence to each bit in encoded complement tuning signal 155 (and to each bit in inverted complement encoded tuning signal 156). Each slice drives a common internal node 160. An inverter 140 inverts a voltage for common internal node to form a digital mixer output signal 165 (the interpolated clock output signal from phase interpolator 100).

Figure 2:
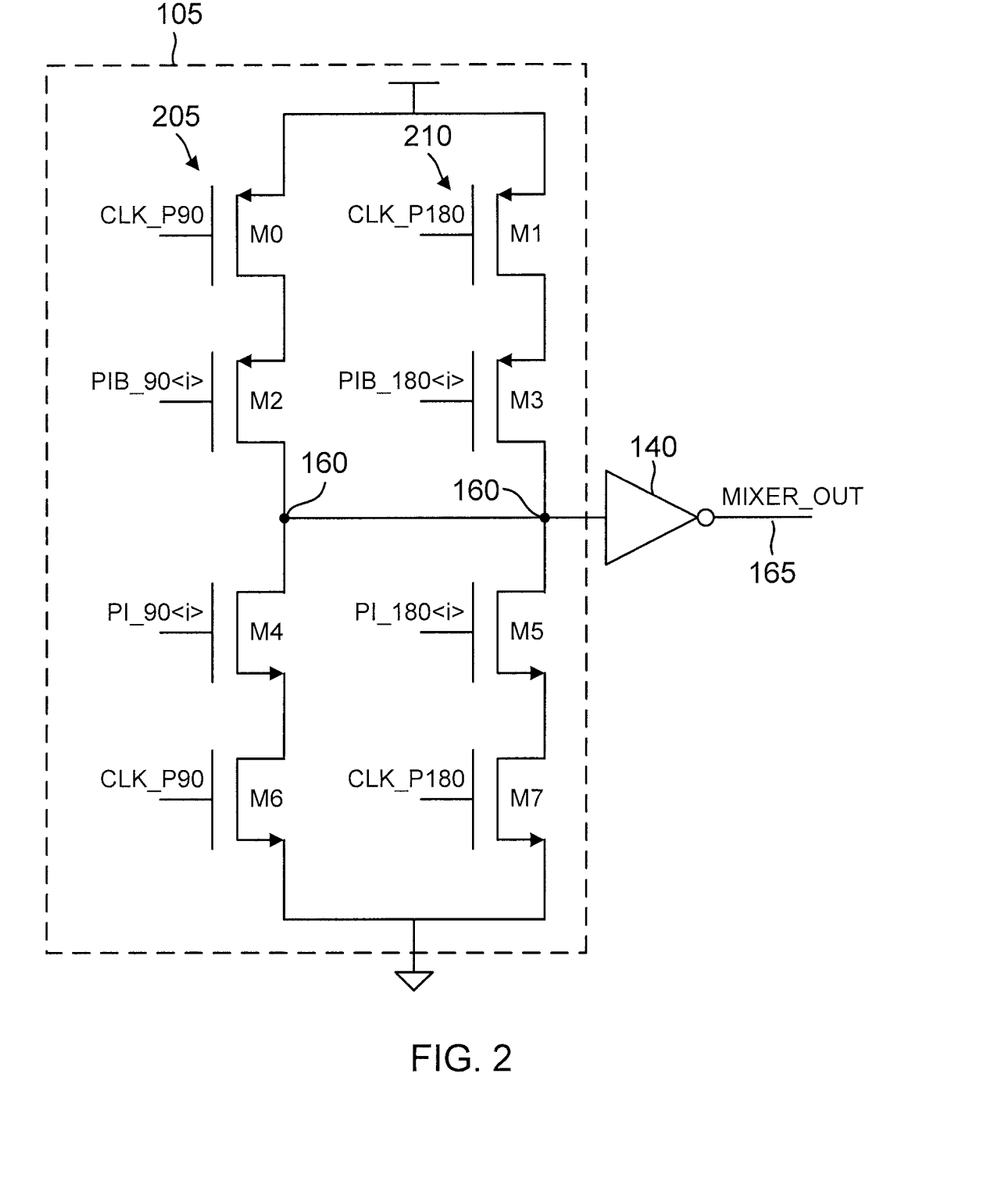
FIG. 2 is a circuit diagram of a slice in a digital mixer in the phase interpolator of FIG. 1.

An example slice 105 is shown in more detail in FIG. 2. In this embodiment, clock A of FIG. 1 is instantiated by a 90 degree clock signal (CLK_P90) whereas clock signal B is instantiated by a 180 degree clock signal (CLK_P180). The phases for the clock signals are defined with regard to a source clock signal (not illustrated). The 90 degree clock signal is delayed in phase by 90 degrees with regard to the source clock signal whereas the 180 degree clock is delayed in phase by 180 degrees with regard to the source clock signal. To interpolate between the two clock signals, slice 105 includes a first inverter 205 and a second inverter 210. First inverter 205 includes a PMOS transistor M0 having a source tied to a power supply node supplying a power supply voltage VDD and a drain that couples to common internal node 160 through a PMOS transistor M2. First inverter 205 also includes an NMOS transistor M6 having a source tied to ground and a drain that couples to common internal node 160 through an NMOS transistor M4. The 90 degree clock signal drives the gates of transistors M0 and M6 in first inverter 205. Transistors M2 and M4 act in common as a switch such that inverter 205 is either coupled to invert the 90 degree clock signal to drive common internal node 160 or is isolated from common internal node 160. In FIG. 2, slice 105 is the ith slice in the group of ($2^n-1$) slices for a phase interpolator such as phase interpolator 100 of FIG. 1. The gate of transistor M4 is thus controlled by the ith bit for an encoded tuning signal (PI_90<i>) that is an instantiation of encoded tuning signal 125 discussed with regard to FIG. 1. A complement of the encoded tuning signal (PIB_90<i>) that is an instantiation of inverted encoded tuning signal 126 (FIG. 1) drives the gate for transistor M2. Should encoded tuning signal PI_90<i> be asserted high to the power supply voltage VDD, first inverter 205 thus inverts first clock signal (CLK_P90) to drive common internal node 160 accordingly.

Second inverter 210 in slice 105 includes a PMOS transistor M1 having a source tied to the power supply node and a drain that couples to common internal node 160 through a PMOS transistor M3. Second inverter 210 also includes an NMOS transistor M7 having a source tied to ground and a drain that couples to common internal node 160 through an NMOS transistor M5. The 180 degree clock signal drives the gates of transistors M1 and M7 in second inverter 210. Transistors M3 and M5 act in common as a switch such that second inverter 210 is either coupled to invert the 180 degree clock signal to drive common internal node 160 or is isolated from common internal node 160. Since slice 105 is the ith slice as discussed above, the gate of transistor M5 is thus controlled by the ith bit for a complement encoded tuning signal (PI_180<i>) that is an instantiation of encoded complement tuning signal 155 discussed with regard to FIG. 1. A complement encoded tuning signal (PIB_180<i>) that is an instantiation of inverted complement encoded tuning signal 156 drives the gate of transistor M3. Should complement encoded tuning signal PI_180<i> be asserted high to the power supply voltage VDD, second inverter 210 thus inverts the second clock signal (in this example, CLK_P180) to drive common internal node 160 accordingly.

The resulting resolution for phase interpolator 100 may be better appreciated with regard to a 3-bit instantiation for tuning signal 110 and an interpolation of the 90 degree and 180 degree clocks. N-bit tuning signal 110 may then be denoted as a 3-bit 90 degree tuning signal TI_90<2:0> whereas complement n-bit tuning signal 115 may be denoted as a 3-bit 180 degree tuning signal TI_180<2:0>. It may be shown that the resulting interpolated clock output signal 165 will then range from 90 degrees to 180 degrees according to the formula of:

$$(90+180)/2+(90)/(2*7)*((TI\_180<2:0>+\text{one-bit additional tuning signal})-TI\_90<2:0>)$$

with the caveat that the addition of complement tuning signal TI_180<2:0> and the one-bit additional tuning signal 145 is saturated at 3 bits. Given this caveat, the resulting phase interpolation occurs as the following table:

TABLE 1

| Clock A (degrees) | Clock B (degrees) | Additional Tuning Signal | TI_180<2:0> | TI_90<2:0> | Output Phase |
|---|---|---|---|---|---|
| 90 | 180 | 0 | 0 | 7 | 90.0 |
| 90 | 180 | 1 | 0 | 7 | 96.4 |
| 90 | 180 | 0 | 1 | 6 | 102.9 |
| 90 | 180 | 1 | 1 | 6 | 109.3 |
| 90 | 180 | 0 | 2 | 5 | 115.7 |
| 90 | 180 | 1 | 2 | 5 | 122.1 |
| 90 | 180 | 0 | 3 | 4 | 128.6 |
| 90 | 180 | 1 | 3 | 4 | 135.0 |
| 90 | 180 | 0 | 4 | 3 | 141.4 |
| 90 | 180 | 1 | 4 | 3 | 147.9 |
| 90 | 180 | 0 | 5 | 2 | 154.3 |
| 90 | 180 | 1 | 5 | 2 | 160.7 |
| 90 | 180 | 0 | 6 | 1 | 167.1 |
| 90 | 180 | 1 | 6 | 1 | 173.6 |
| 90 | 180 | 0 | 7 | 0 | 180.0 |

Figure 3A:
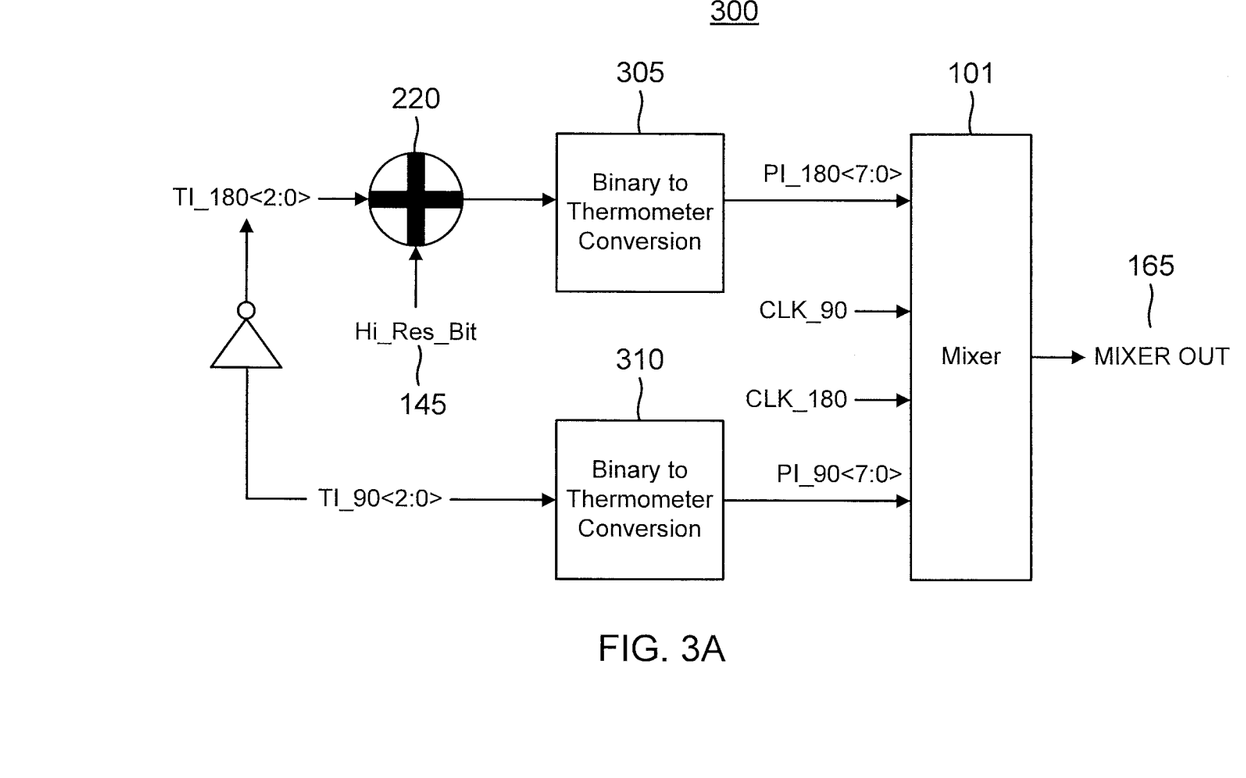
FIG. 3A is a diagram of a phase interpolator responsive to a 3-bit tuning signal and a high-resolution bit signal, wherein the phase interpolator includes an adder in accordance with an aspect of the disclosure.

A resulting phase interpolator 300 responsive to a 3-bit tuning signal TI_90<2:0> and a complement 3-bit tuning signal TI_180<2:0> is shown in FIG. 3A. A thermometer encoder 310 encodes the 3-bit tuning signal TI_90<2:0> into a 7-bit-wide encoded tuning signal PI_90<7:0> for the mixing of the 90 degree clock (CLK_90) in digital mixer 101. In addition, the 3-bit tuning signal TI_90<2:0> is inverted into a complement 3-bit tuning signal TI_180<2:0> that is added with one-bit additional tuning signal 145 in an adder 220 to form a sum complement tuning signal. A thermometer encoder 305 encodes the sum complement tuning signal into a 7-bit complement encoded tuning signal PI_180<7:0> for the mixing of the 180 degree clock (CLK_180) in digital mixer 101. Referring again to Table 1, note that once complement encoded tuning signal TI_180<2:0> reaches the value of 7, it can go no higher as there are only seven slices (not illustrated) in mixer 101 for phase interpolator 300. So in contrast to the lower values for the complement encoded tuning signal TI_180<2:0>, one-bit additional tuning signal 145 can only equal zero when the complement encoded tuning signal PI_180<2:0> equals seven. In that regard, one-bit additional tuning signal 145 can of course equal one when complement encoded tuning signal PI_180<2:0> equals seven but because of the saturation in adder 220, this assertion of one-bit additional tuning signal 145 when complement encoded tuning signal PI_180<2:0> does not affect the phase interpolator resolution.

Figure 3B:
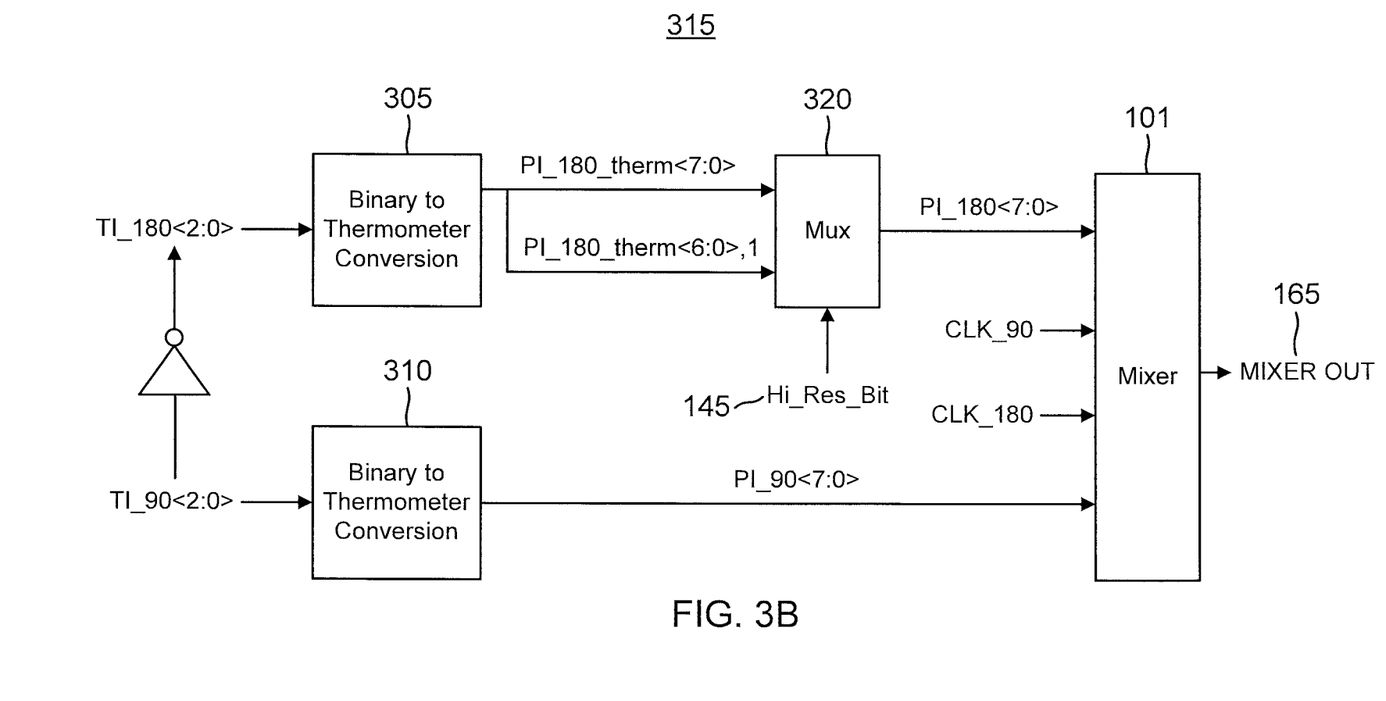
FIG. 3B is a diagram of a phase interpolator responsive to a 3-bit tuning signal and a high-resolution bit signal, wherein the phase interpolator includes an 8-bit-wide multiplexer in accordance with an aspect of the disclosure.

In alternative embodiments, the complication of a saturated addition may be eliminated. For example, a phase interpolator 315 shown in FIG. 3B does not include an adder. The 3-bit tuning signal TI_90<2:0> is thermometer encoded in thermometer encoder 310 into the 7-bit encoded tuning signal PI_90<7:0> as discussed with regard to phase interpolator 300. Similarly, the 3-bit tuning signal TI_90<2:0> is inverted into the 3-bit complement tuning signal TI_180<2:0>. In contrast to phase interpolator 300, encoder 305 encodes complement tuning signal TI_180<2:0> into a complement encoded tuning signal PI_180_therm<7:0>. A multiplexer 320 is configured to select for complement encoded tuning signal TI_180_therm<7:0> when one-bit additional tuning signal 145 equals a first binary value (e.g., a binary zero) to form the complement encoded tuning signal PI_180<7:0> for the driving of digital mixer 101. In contrast, multiplexer 320 selects for a bit-shifted version of the least-significant first six bits of the complement encoded tuning signal PI_180_therm<7:0> (designated as PI_180_therm<6:0>) along with a binary one for the least significant bit to form the complement encoded tuning signal PI_180<7:0> when one-bit additional tuning signal 145 equals a second binary value (for example, a binary one). In this fashion, mixer output signal 165 may possess the output phases shown in Table 1 without any saturated addition.

Figure 3C:
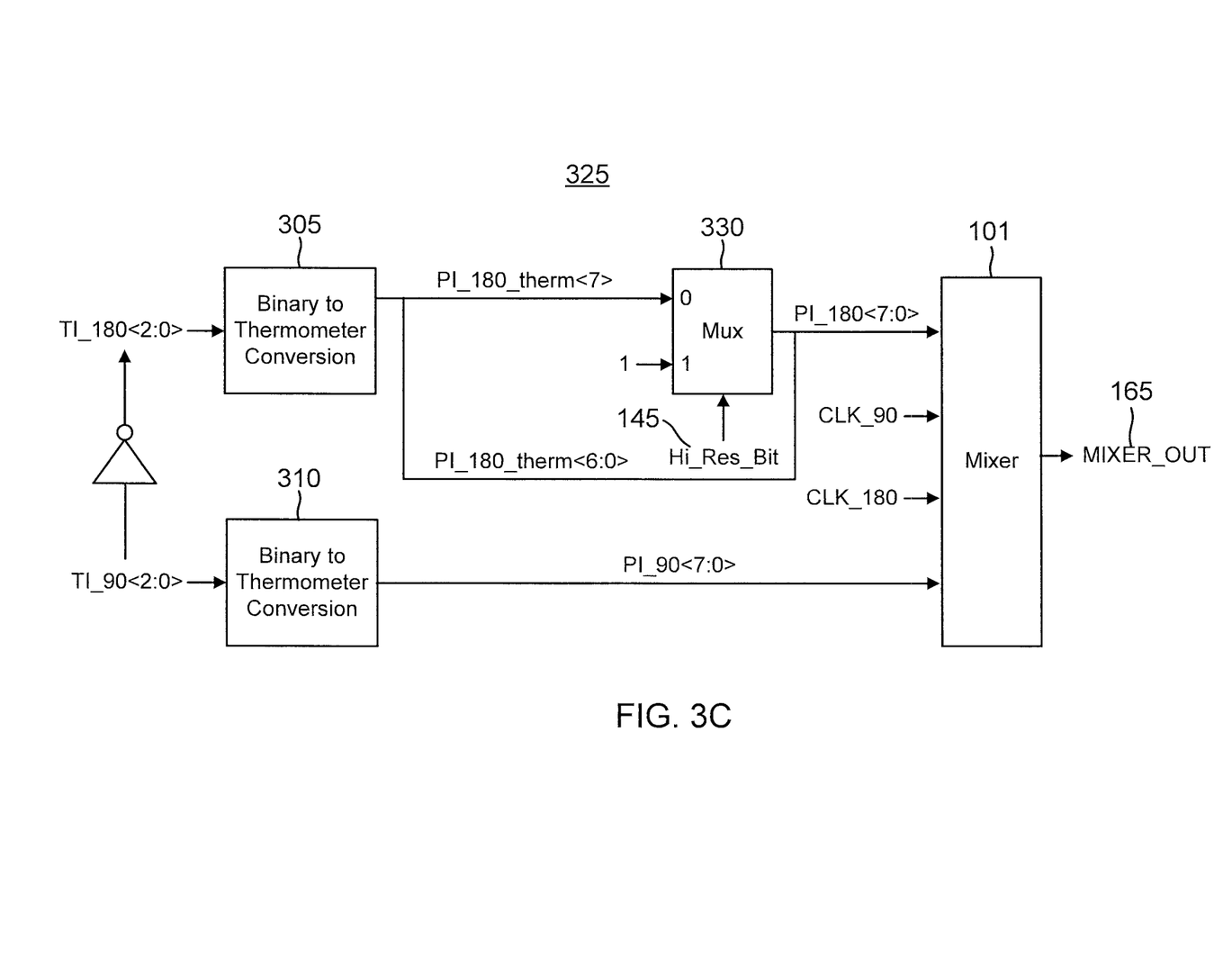
FIG. 3C is a diagram of a phase interpolator responsive to a 3-bit tuning signal and a high-resolution bit signal, wherein the phase interpolator includes a 1-bit-wide multiplexer in accordance with an aspect of the disclosure.

Multiplexer 320 is a 7-bit wide multiplexer so it can provide the 7-bit wide complement encoded tuning signal PI_180<7:0> to digital mixer 101. A simpler one-bit multiplexer 330 may be used as shown in FIG. 3C for a phase interpolator 325. As discussed with regard to phase interpolators 300 and 315, the 3-bit tuning signal TI_90<2:0> is encoded in thermometer encoder 310 into the 7-bit encoded tuning signal PI_90<7:0>. Similarly, the 3-bit tuning signal TI_90<2:0> is inverted to become the 3-bit complement tuning signal TI_180<2:0>, which in turn is encoded by thermometer encoder 305 into the complement encoded tuning signal PI_180 therm<7:0>. The first six bits of the complement encoded tuning signal PI_180 therm<7:0> bypass multiplexer 330 to drive mixer 101 accordingly as the first six bits in complement encoded tuning signal PI_180<7:0>. Multiplexer 330 selects for the seventh bit produced by encoder 305 (PI_180_therm<7>) responsive to one-bit additional tuning signal 145 equaling a first binary value such as a binary zero to drive the seventh bit of complement encoded tuning signal PI_180<7:0>. Conversely, multiplexer 330 selects for a binary one value to drive the seventh bit of complement encoded tuning signal PI_180<7:0> when the one-bit additional tuning signal 145 has a second binary value such as a binary one value. A method of operation for a phase interpolation will now be discussed.

Regardless of the phase interpolator instantiation as discussed with regard example phase interpolators 300, 315, and 325, note that each slice may be deemed to have a first switch configured to couple a first clock signal to an output node responsive to an assertion of a corresponding bit in an encoded tuning signal. An example of the first switch is formed by switch transistors M2 and M4 in slice 105 of FIG. 2. The first clock signal would be the 90 degree clock signal CLK_P90 of FIG. 2 in such an example. Similarly, each slice may be deemed to have a second switch configured to couple a second clock signal to the output node responsive to an de-assertion of the corresponding bit in the encoded tuning signal. An example of the second switch is formed by switch transistors M3 and M5 in slice 105 of FIG. 2. The second clock signal would be the 180 degree clock signal CLK_P180 in such an example. Finally the second switch in one of the slices is further configured to couple the second clock signal to the output node responsive to an assertion of an additional tuning signal. Switch transistors M3 and M5 in a slice 105 corresponding to the least significant bit of complement encoded tuning signal PI_180<7:0> in phase interpolators 300, 315, or 325 is an example of such a second switch. Note that the assertion of the additional tuning signal is independent of the assertion of whether the corresponding bit in the encoded tuning signal is asserted or not as discussed with regard to the additional tuning signal of Table 1.

Figure 4:
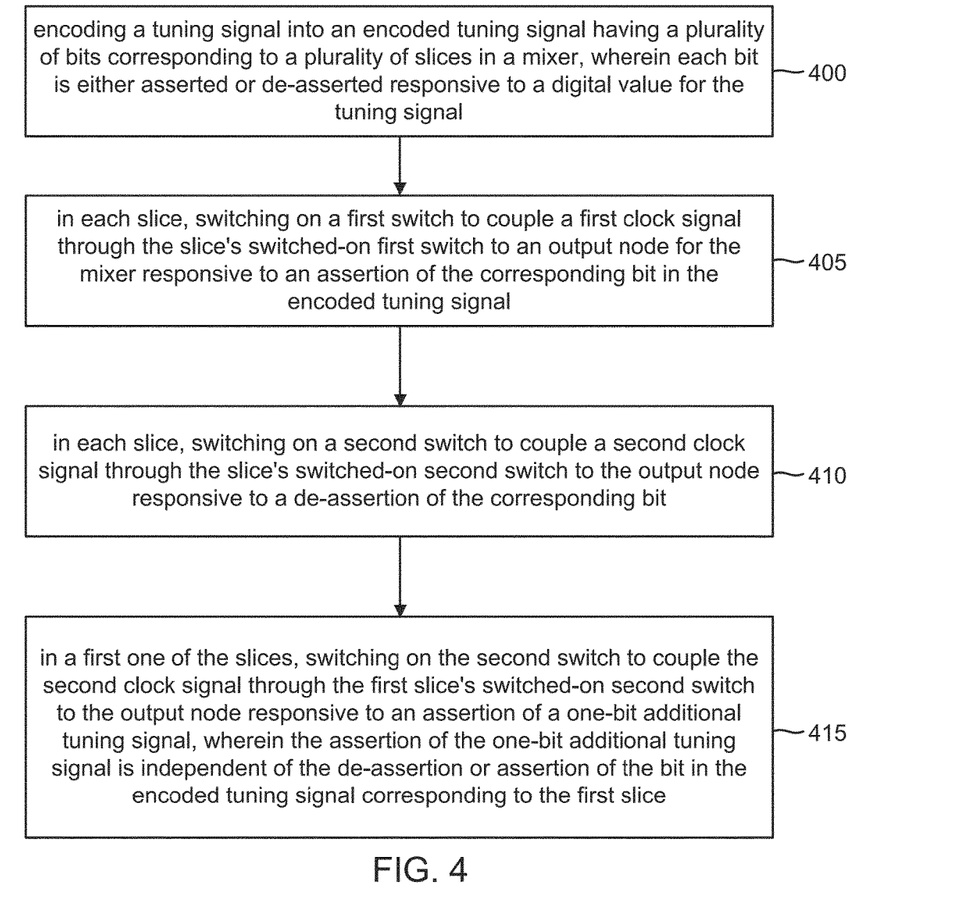
FIG. 4 is a flowchart for an example method of phase interpolation in accordance with an aspect of the disclosure.

A flowchart for a method of phase interpolation is shown in FIG. 4. The method includes an act 400 encoding a tuning signal into an encoded tuning signal having a plurality of bits corresponding to a plurality of slices in a mixer, wherein each bit is either asserted or de-asserted responsive to a digital value for the tuning signal. An example of act 400 may be made in reference to Table 1. Suppose that the integer equivalent of the tuning signal TI_90<2:0> is 4. Four bits in the corresponding encoded tuning signal PI_90<7:0> would then be asserted.

In addition, the method includes an act 405 of, for each slice, switching on a first switch to couple a first clock signal through the slice's switched-on first switch to an output node for the mixer responsive to an assertion of the corresponding bit in the encoded tuning signal. Following the example discussed with regard to act 400, the switching on of switch transistors M2 and M4 in the four slices corresponding to the four asserted bits in tuning signal PI_90<7:0> is an example of act 405.

The method also includes an act 410 of, in each slice, switching on a second switch to couple a second clock signal through the slice's switched-on second switch to the output node responsive to a de-assertion of the corresponding bit. Continuing with the example discussed with regard to acts 400 and 405, the switching on of switch transistors M3 and M5 in the three slices corresponding to the three de-asserted bits in tuning signal PI_90<7:0> is an example of act 410.

Finally, the method includes an act 415 of, in a first one of the slices, switching on the second switch to couple the second clock signal through the first slice's switched-on second switch to the output node responsive to an assertion of a one-bit additional tuning signal, wherein the assertion of the one-bit additional tuning signal is independent of the de-assertion or assertion of the bit in the encoded tuning signal corresponding to the first slice. As discussed with regard to Table 1, the assertion of one-bit additional tuning signal 145 is independent of the value for the tuning signals TI_90<2:0>.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A phase interpolator, comprising:
   a first thermometer encoder configured to encode a tuning signal into an encoded tuning signal having a plurality of bits;
   an output node; and
   a digital mixer including a plurality of slices corresponding on a one-to-one basis to the plurality of bits in the encoded tuning signal, and wherein each slice includes a first switch configured to couple a first clock signal to the output node responsive to an assertion of a corresponding bit in the encoded tuning signal and includes a second switch configured to couple a second clock signal to the output node responsive to an assertion of a complement of the corresponding bit in the encoded tuning signal, and wherein a first slice in the plurality of slices is further configured to couple simultaneously the second clock signal and the first clock signal to the output node responsive to an assertion of an additional digital tuning signal and an assertion of the corresponding bit in the encoded tuning signal.

2. The phase interpolator of claim 1, further comprising:
   an adder configured to add the additional digital tuning signal with a complement of the encoded tuning signal to form a sum complement tuning signal, and wherein the first thermometer encoder is further configured to encode the sum complement tuning signal into a complement encoded tuning signal having a plurality of bits corresponding on a one-to-one basis to the plurality of slices, and wherein the second switch in the first slice is configured to be responsive to the assertion of the additional digital tuning signal by being responsive to an assertion of the corresponding bit in the complement encoded tuning signal.

3. The phase interpolator of claim 1, wherein the additional digital tuning signal is an additional one-bit tuning signal, the phase interpolator further comprising:
   a second thermometer encoder configured to encode a complement of the tuning signal into a complement encoded tuning signal having a plurality of bits corresponding on a one-to-one basis to the plurality of slices;
   a multiplexer configured to provide the complement encoded tuning signal to the digital mixer responsive to the additional one-bit tuning signal having a first binary value and to provide a bit-shifted version of the complement encoded tuning signal to the digital mixer responsive to the additional one-bit tuning signal having a second binary value, and wherein the second switch in the first slice is configured to couple the second clock signal to the output node responsive to an assertion of the corresponding bit in the bit-shifted version of the complement encoded tuning signal.

4. The phase interpolator of claim 1, wherein the additional digital tuning signal is an additional one-bit tuning signal, the phase interpolator further comprising:
  a second thermometer encoder configured to encode a complement of the tuning signal into a complement encoded tuning signal having a plurality of bits corresponding on a one-to-one basis to the plurality of slices;
  a multiplexer configured to select between a binary high signal and a bit in the complement encoded tuning signal corresponding to the first slice to provide a signal for controlling the second switch in the first slice, wherein the multiplexer is configured to select for the binary high signal responsive to an assertion of the additional one-bit tuning signal and to select for the corresponding bit in the complement encoded signal responsive to a de-assertion of the additional one-bit tuning signal.

5. The phase interpolator of claim 4, wherein the first thermometer encoder and the second thermometer encoder comprises a single thermometer encoder.

6. The phase interpolator of claim 1, wherein the additional tuning signal is an additional one-bit tuning signal, the phase interpolator further comprising:
  a second thermometer encoder configured to encode a complement of the tuning signal into a complement encoded tuning signal having a plurality of bits corresponding on a one-to-one basis to the plurality of slices, wherein a first bit in the complement encoded tuning signal corresponds to the first slice; and
  a multiplexer configured to assert the first bit in the complement encoded tuning signal to equal first binary value responsive to an assertion of the additional one-bit tuning signal and to leave the first bit unchanged from the second encoder responsive to a de-assertion of the additional one-bit tuning signal.

7. The phase interpolator of claim 1, wherein each first switch comprises a pair of transistors, and wherein each second switch comprises a pair of transistors.

8. The phase interpolator of claim 7, wherein each slice includes a first inverter configured to invert the first clock signal to drive an internal node of the slice when the slice's first switch is switched on, and wherein each slice includes a second inverter configured to invert the second clock signal to drive the internal node when the slice's second switch is switched on.

9. The phase interpolator of claim 8, further comprising an inverter configured to invert a voltage for the internal node to drive the output node.

10. A method, comprising:
  thermometer encoding a tuning signal into an encoded tuning signal having a plurality of bits corresponding on a one-to-one basis to a plurality of slices in a mixer, wherein each bit is either asserted or de-asserted responsive to a digital value for the tuning signal;
  in each slice, switching on a first switch to couple a first clock signal through the slice's switched-on first switch to an output node for the mixer responsive to an assertion of the corresponding bit in the encoded tuning signal;
  in each slice, switching on a second switch to couple a second clock signal through the slice's switched-on second switch to the output node responsive to a de-assertion of the corresponding bit in the encoded tuning signal; and
  in a first slice in the plurality of slices, switching on the second switch and switching on the first switch to simultaneously couple the first clock signal and the second clock signal to the output node responsive to an assertion of a one-bit additional tuning signal and an assertion of the corresponding bit in the encoded tuning signal.

11. The method of claim 10, wherein switching on the first switch in each slice comprises switching on a pair of transistors in the slice.

12. The method of claim 10, wherein switching on the second switch in each slice comprises switching on a second pair of transistors in the slice.

13. The method of claim 10, wherein the tuning signal is an n-bit wide tuning signal, n being a positive integer, and wherein the total number of slices equals $2^n-1$.

* * * * *